(12) United States Patent
Gomi et al.

(10) Patent No.: US 7,767,574 B2
(45) Date of Patent: Aug. 3, 2010

(54) METHOD OF FORMING MICRO METAL BUMP

(75) Inventors: Yoshihiro Gomi, Nagano (JP); Masahiro Aoyagi, Ibaraki (JP); Hiroshi Nakagawa, Ibaraki (JP); Katsuya Kikuchi, Ibaraki (JP); Yoshikuni Okada, Ibaraki (JP); Hirotaka Oosato, Ibaraki (JP)

(73) Assignees: Kabushiki Kaisha Mikuni Kogyo, Nagano (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/225,741

(22) PCT Filed: Mar. 30, 2007

(86) PCT No.: PCT/JP2007/057031

§ 371 (c)(1),
(2), (4) Date: Sep. 29, 2008

(87) PCT Pub. No.: WO2007/114314

PCT Pub. Date: Oct. 11, 2007

(65) Prior Publication Data

US 2009/0104766 A1    Apr. 23, 2009

(30) Foreign Application Priority Data

Mar. 30, 2006  (JP)  .............................. 2006-095896

(51) Int. Cl.
*H01L 21/44*    (2006.01)

(52) U.S. Cl. ................. 438/613; 438/612; 438/679; 438/686

(58) Field of Classification Search ............. 438/613, 438/679

See application file for complete search history.

(56) References Cited

U.S. PATENT DOCUMENTS

| | | | | |
|---|---|---|---|---|
| 4,912,634 A | * | 3/1990 | Nakano et al. | ............... 712/207 |
| 5,328,078 A | * | 7/1994 | Okumura | ................. 228/179.1 |
| 5,529,634 A | * | 6/1996 | Miyata et al. | ............... 118/726 |
| 2001/0003296 A1 | * | 6/2001 | Morimoto et al. | ........... 156/277 |
| 2004/0017527 A1 | * | 1/2004 | Ryu | ........................... 349/113 |
| 2004/0235296 A1 | * | 11/2004 | Bailey et al. | ................ 438/686 |

FOREIGN PATENT DOCUMENTS

| | | | |
|---|---|---|---|
| JP | 64-84738 A | | 3/1989 |
| JP | 4-225235 A | | 8/1992 |
| JP | 5-47771 A | | 2/1993 |
| JP | 7-115097 A | | 5/1995 |
| JP | 11-260848 A | | 9/1999 |
| JP | 2002-184804 A | | 6/2002 |
| JP | 2002184804 A | * | 6/2002 |
| JP | 2005-86127 A | | 3/2005 |

OTHER PUBLICATIONS

JP 2002184804 A Machine Translation.*

* cited by examiner

*Primary Examiner*—Charles D Garber
*Assistant Examiner*—Bryan R Junge
(74) *Attorney, Agent, or Firm*—Birch, Stewart, Kolasch & Birch, LLP

(57) ABSTRACT

The present invention provides a method of forming a micro metal bump, which is capable of stably and industrially forming a micro metal bump, by a gas deposition process, at a prescribed position of a metal part formed on one side surface of a substrate. The method comprises the steps of: forming a straight hole (34) in a mask layer (30) covering one side surface of a substrate (10) on which a wiring pattern (12) is formed, wherein a prescribed position of the wiring pattern (12) is exposed in a bottom surface of the straight hole and the straight hole has an inner wall perpendicular to the one side surface of the substrate (10) and a sharp top opening portion; providing a metal plate, whose area is larger than that of the substrate (10), on the other side surface of the substrate (10) as a heat sink; placing the substrate (10) and the metal plate in a vacuum; forming a tapered metal bump (14) on the exposed surface of the wiring pattern (12), which is exposed in the bottom surface of the straight hole (34), by a gas deposition process, in which metal nanoparticles obtained by evaporating a metal are ejected from a nozzle together with a carrier gas so as to deposit on the prescribed position, with cooling the substrate (10) to a temperature lower than upper temperature limit of resin constituting the mask layer (30), by the metal plate as the heat sink, so as to retain a configuration of the straight hole (34); and removing the mask layer (30) from the one side surface of the substrate so as to complete the tapered metal bump (14) at the prescribed position of the wiring pattern (12).

9 Claims, 10 Drawing Sheets

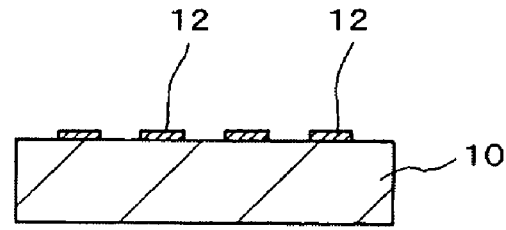
FIG.15A
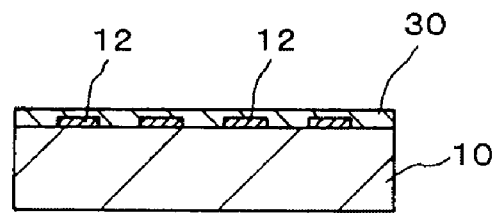
FIG.15B
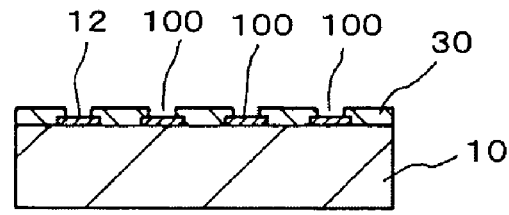
FIG.15C
FIG.16
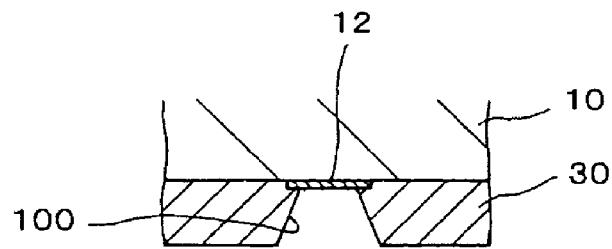
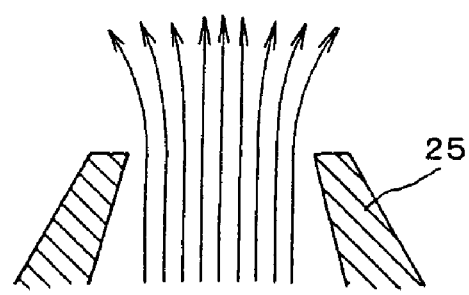

METHOD OF FORMING MICRO METAL BUMP

FIELD OF TECHNOLOGY

The present invention relates to a method of forming a micro metal bump, moreover relates to a method of forming a micro metal bump, in which tapered micro metal bumps are formed at prescribed positions of metal part formed on one side surface of a substrate.

BACKGROUND TECHNOLOGY

In electronic parts, e.g., semiconductor devices, tapered metal bumps composed of, for example, gold are formed at ends of wiring patterns, which are composed of copper and formed on one side surface of a substrate composed of plastic, ceramic, etc., for being connected to other electronic parts. For example, a method of forming a tapered metal bump by a gas deposition process is disclosed in Patent Document 1.

The disclosed method is shown in FIG. 14. In the method shown in FIG. 14, a resin mask layer 204 covering wiring patterns 202, 202 . . . formed on one side surface of a substrate 200 is patterned, holes 206 in which the wiring patterns 202 are exposed in the bottom surfaces are formed, and then the substrate 200 is mounted on a movable stage 208 as shown in FIG. 14A.

Next, as shown in FIG. 14A, the movable stage 208 is continuously moved from side to side in a direction X, and metal nanoparticles produced by a gas deposition system are ejected from a large diameter nozzle 210, whose diameter is larger than inner diameters of the holes 206, toward the holes 206, 206 . . . .

The metal nanoparticles ejected from the nozzle 210 deposit on the mask layer 204 and form a deposited layer 212, further they deposit in the bottom surfaces of the holes 206, 206 . . . and form metal bumps 214, whose top surfaces are nearly flat.

Then, ejecting the metal nanoparticles from the large diameter nozzle 210 is stopped, and thereafter the metal nanoparticles are ejected from a small diameter nozzle 216, whose diameter is smaller than the inner diameters of the holes 206, toward the top surfaces of the metal bumps 214 formed in the selected holes 206 of the holes 206, 206 . . . which have been formed on the one side surface of the still substrate 200. The metal nanoparticles ejected from the small diameter nozzle 216 deposit on the flat top surfaces of the metal bumps 218 and form the tapered metal bumps 218.

Patent Document 1: Japanese Patent Kokai Gazette No. 2002-184804

DISCLOSURE OF THE INVENTION

By the method of forming a metal bump shown in FIG. 14, the tapered metal bumps 218 can be formed at prescribed positions of the wiring patterns 202.

However, in the method shown in FIG. 14, the metal nanoparticles must be ejected from the small diameter nozzle 216 toward each of the holes 206, 206 . . . so as to form the tapered metal bumps 218 in each of the holes 206, 206 . . . formed in the mask layer 204.

It takes a very long time to form the tapered metal bumps 218 in the holes 206, 206 . . . formed in the wiring patterns 202, 202 . . . of the substrate 200, in order, with the small diameter nozzle 216, so this method is not suitable for industrial production.

If the multiple small diameter nozzles 216, 216 . . . are used to simultaneously form the tapered metal bumps 218 in the multiple holes 206, 206 . . . , the metal nanoparticles must be uniformly ejected from the multiple small diameter nozzles 216, 216 . . . , but it is very difficult. Therefore, the tapered metal bumps 218, 218 . . . will have different shapes and heights.

These days, forming micro metal bumps in semiconductor devices has been required, so it is difficult to prepare the small diameter nozzle 216 whose diameter is smaller than the inner diameters of the holes 206.

The present invention solves the problem of the conventional method using the gas deposition process, in which metal nanoparticles are ejected together with a carrier gas to deposit, i.e., a micro metal bump cannot be stably and industrially formed at a prescribed position of a metal part provided on one side surface of a substrate, thus an object of the present invention is to provide a method of forming a micro metal bump, which is capable of stably and industrially forming a micro metal bump at a prescribed position of a metal part provided on one side surface of a substrate.

As shown in FIG. 14, the inventors of the present invention tried to form tapered metal bumps by the gas deposition process with using one nozzle after forming the mask layer 204 on the one side surface of the substrate 200, on which the wiring patterns 202 had been formed, and forming the holes 206, in which the wiring patterns 202 were exposed in the bottom surface of the mask layer 204.

Firstly, as shown in FIGS. 15A and 15B, a resin mask layer 30 covering wiring patterns 12, 12 . . . of a substrate 10 was formed, and the mask layer 30 was processed by laser means so as to form holes 100, in which prescribed positions of the wiring patterns 12 were exposed in bottom surfaces (see FIG. 15C).

As shown in FIG. 16, each of the holes 100 shown in FIG. 15C was a small reverse-tapered hole, in which an area of a bottom surface was smaller than that of a top surface opened in the surface of the mask layer 30.

Next, metal nanoparticles, which were obtained by evaporating a metal in a gas deposition system, were ejected from a nozzle 25 together with a helium gas, which acted as a carrier gas, toward the substrate shown in FIG. 15C. A diameter of the nozzle 25 was larger than inner diameters of the holes 100.

The metal nanoparticles ejected from the nozzle 25 deposited on not only exposed surfaces of the wiring patterns 12, which were exposed in the bottom surfaces of the holes 100, but also inner surfaces of the holes 100 and the surface of the mask layer 30. As shown in FIG. 17, when ejecting the metal nanoparticles and the helium gas was stopped after a lapse of a prescribed time, a projected part 102, which was formed by depositing the metal nanoparticles on the prescribed position of the wiring pattern 12, was connected to the deposited layer 32, which deposited on the surface of the mask layer 30, by a deposited layer 103 of the metal nanoparticles, which deposited on the inner surfaces of the hole 100. In this state, the projected part 102 was peeled from the wiring pattern 12 together with the mask layer 30 when the mask layer 30 was peeled from the substrate 10.

As shown in FIG. 18, in case of forming a hole 104, in which inner surfaces were perpendicular to the one side surface of the substrate 10 and a top opening portion 104a was rounded, in the mask layer 30, the metal bump 14 was formed in the hole 104 by the gas deposition process, thereby the tapered metal bump 14 was formed in the hole 104 and edges of the deposited layer 32 on the surface of the mask layer 30 inwardly extended from edges of the hole 104. The top end of the tapered metal bump 14 contacted the edges of the deposited layer 32. In this state, the tapered metal bump 14 was peeled from the wiring pattern 12 together with the mask layer 30 when the mask layer 30 was peeled from the substrate 10.

On the other hand, as shown in FIG. 19, a reverse-tapered hole 104, in which an area of a bottom surface in which the wiring pattern 12 was exposed was larger than that of a top surface opened in the surface of the mask layer 30, was formed in the mask layer 30, and the tapered metal bump 14 was formed in the reverse-tapered hole 104 by the gas deposition process, thereby the tapered metal bump 14 was independently formed without contacting the edges of the deposited layer 32, which deposited on the surface of the mask layer 30 and inwardly extended from the edges of the reverse-tapered hole 104. Therefore, the tapered metal bump 14 could be formed at the prescribed position of the wiring pattern 12 by removing the mask layer 30 from the substrate 10.

However, it is difficult to industrially form the reverse-tapered holes 106 in the mask layer 30 covering the substrate 10.

The inventors studied to form the tapered metal bump 14, which was independent from the deposited layer 32 on the surface of the mask layer 30, in the hole 104 shown in FIG. 18, which was easily formed in the mask layer 30 by optically exposing and developing photoresist.

As the result of the study, they found that the tapered metal bump 14 could be independently formed, in the hole 104, from the deposited layer 32 on the surface of the mask layer 30 by retaining the top opening portion 104a of the hole 104 in a sharp edge while forming the tapered metal bump 14 by ejecting the metal nanoparticles and the helium gas from the nozzle 25 toward the bottom surface of the hole 104, so that they reached the present invention.

Namely, the present invention is a method of forming a micro metal bump comprising the steps of: forming a straight hole in a mask layer covering one side surface of a substrate on which a metal part is formed, wherein a prescribed position of the metal part is exposed in a bottom surface of the straight hole and the straight hole has an inner wall perpendicular to the one side surface of the substrate and a sharp top opening portion; providing cooling means on the other side surface of the substrate; placing the substrate and the cooling means in a vacuum; forming a tapered metal bump, whose cross sectional area is gradually reduced from a bottom part to a top part, on the exposed surface of the metal part, which is exposed in the bottom surface of the straight hole, by a gas deposition process, in which metal nanoparticles obtained by evaporating a metal are ejected from a nozzle together with a carrier gas so as to deposit the metal nanoparticles on the prescribed position, with cooling the substrate to a temperature lower than upper temperature limit of resin constituting the mask layer, by the cooling means, so as to retain a configuration of the straight hole; and removing the mask layer from the one side surface of the substrate so as to complete the tapered metal bump at the prescribed position of the metal part.

In the method, the mask layer, in which the straight hole of the photoresist layer has been formed by optically exposing and developing and being formed on the one side surface of the substrate, is heat-treated at a prescribed temperature capable of retaining the shape at the top opening portion of the straight hole so as to adhere the mask layer onto the one side surface of the substrate, whereby the top opening portion of the straight hole, which is formed in the mask layer of the substrate to be treated by the gas deposition process, can be formed into a sharpened shape. Preferably, the heat treatment is performed at a temperature of 100° C. or below.

Further, the cooling means may be a metal heat sink, so that the substrate can be easily cooled.

For example, the tapered metal bump is formed into a conical shape or a polygonal shape.

In the method, a number of the straight holes having different inner diameters may be formed in the same mask layer, and a number of the tapered metal bumps having different heights may be simultaneously formed.

Preferably, in the gas deposition process, the metal to be evaporated is gold, and the carrier gas is a helium gas.

In the method of the present invention, the straight hole is formed in the mask layer covering the one side surface of the substrate, the prescribed position of the metal part is exposed in the bottom surface of the straight hole, and the metal nanoparticles are ejected from one nozzle toward the straight hole with retaining the configuration of the straight hole, whereby the metal nanoparticles deposit on not only the surface of the mask layer but also the surface of the metal part exposed in the bottom surface of the straight hole.

By further ejecting the metal nanoparticles from the nozzle, edges of a metal nanoparticle deposited layer on the surface of the mask layer gradually and inwardly extended from edges of the straight hole with increasing thickness. Therefore, the inner diameter of the straight hole is gradually reduced, and an amount of the metal nanoparticles depositing on the exposed surface of the metal part is gradually reduced from the inner wall of the straight hole to the center thereof, so that the tapered metal bump can be formed.

Finally, an opened part of the straight hole is entirely closed by the metal nanoparticle deposited layer on the surface of the mask layer, so no metal nanoparticles deposit in the straight hole even if ejecting the metal nanoparticles is continued, and the independent tapered metal bump can be maintained in the straight hole.

Further, in the present invention, the metal bump is formed, by the gas deposition process, with cooling the substrate by the cooling means, so that the shape at the sharp top opening portion of the straight hole can be retained while forming the metal bump. Therefore, the metal bump formed in the straight hole never contacts the edges of the metal particle deposited layer, which inwardly extended from the edges of the straight hole, like a metal bump in a hole having a rounded top opening portion.

Therefore, the tapered metal bump can be formed without contacting the metal particle deposited layer depositing on the surface of the mask layer, and only the mask layer and the metal particle layer can be removed from the one side surface of the substrate.

BRIEF DESCRIPTION OF THE DRAWINGS

FIGS. 15A-15C are explanation views showing a process of forming the straight holes in the mask layer formed on the one side surface of the substrate.

FIG. 16 is a partial cross sectional view, in which metal nanoparticles are ejected form a nozzle of a gas deposition system toward the surface of the mask layer, which is formed on the one side surface of the substrate and which includes reverse-tapered holes.

OPTIMUM EMBODIMENTS OF THE INVENTION

Figure 1A:
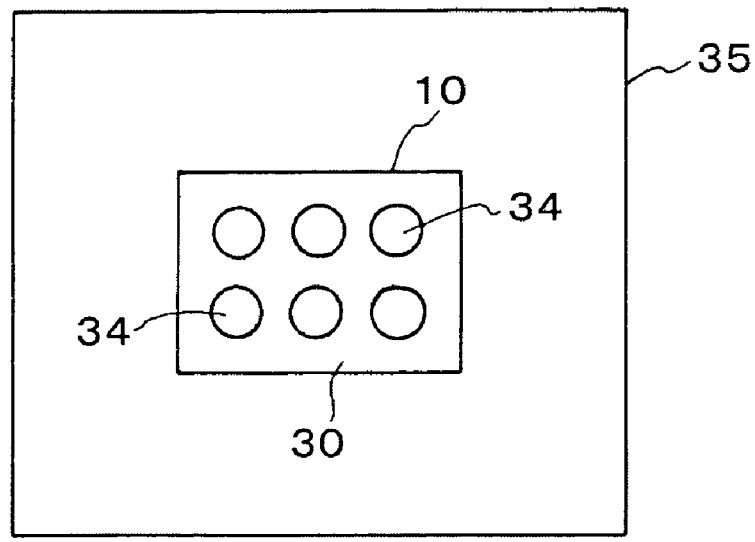
FIGS. 1A and 1B are a front view and a cross sectional view of a substrate and a metal plate used in the present invention.
Figure 1B:
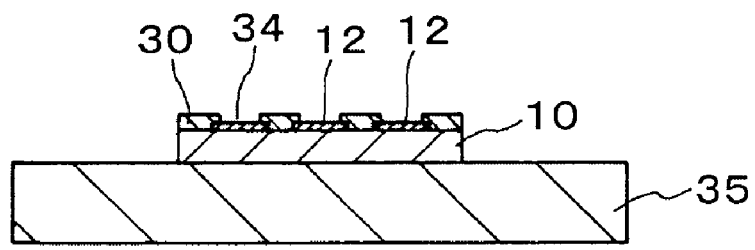

An example of the method of forming a micro metal bump of the present invention is shown in FIGS. 1 and 2. In a substrate 10 shown in FIG. 1A, wiring patterns 12, 12 . . . , which are made of metal, are formed on one side surface of the substrate 10, and the wiring patterns 12, 12 . . . are covered with a resin mask layer 30 as shown in FIG. 1B, which is a cross sectional view. In the mask layer 30, holes 34 are formed at the prescribed positions, so that the surface of the wiring patterns 12, 12 . . . are respectively exposed at the bottom of the holes. As shown in FIG. 1A, the holes 34 have circular shapes. An aspect ratio of the hole 34 (i.e., (a depth of the hole 34)/(an inner diameter of the hole 34)) is 1. The depth of the hole 34 is equal to a thickness of the mask layer 30.

As shown in FIGS. 1A and 1B, the other side surface of the substrate 10 is attached onto a metal plate 35, whose area is larger than that of the substrate 10 and which is composed of a metal having a high heat conductivity, e.g., aluminum, copper. As described later, the metal plate 35 is used as a heat sink, i.e., means for cooling the substrate 10.

Figure 2A:
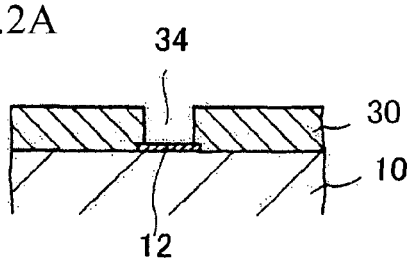
FIGS. 2A-2F are explanation views showing an example of the method of forming a micro metal bump of the present invention, wherein the substrate and the metal plate shown in FIG. 1 are used.

In the hole 34, as shown in FIG. 2A which is the magnified cross sectional view, the surfaces of the wiring pattern 12 is exposed at the bottom of the hole, an inner wall face is perpendicular to the one side surface of the substrate 10, and a top opening portion (on outlet corner portion) is not rounded, so the hole is called a straight hole (straight hole 34).

The substrate 10, which has been mounted on the metal plate 35 and on which the mask layer 30 including the straight holes 34, 34 . . . shown in FIG. 2A has been formed, is set in a vacuum in a gas deposition system, and micro metal bumps are formed on the exposed surfaces of the wiring patterns, which are respectively exposed in the bottom surfaces of the straight holes 34, 34 . . . , by a gas deposition process, in which metal nanoparticles obtained by evaporating a metal are ejected from a nozzle 25, together with a carrier gas, so as to deposit the metal nanoparticles at prescribed positions.

Figure 3:
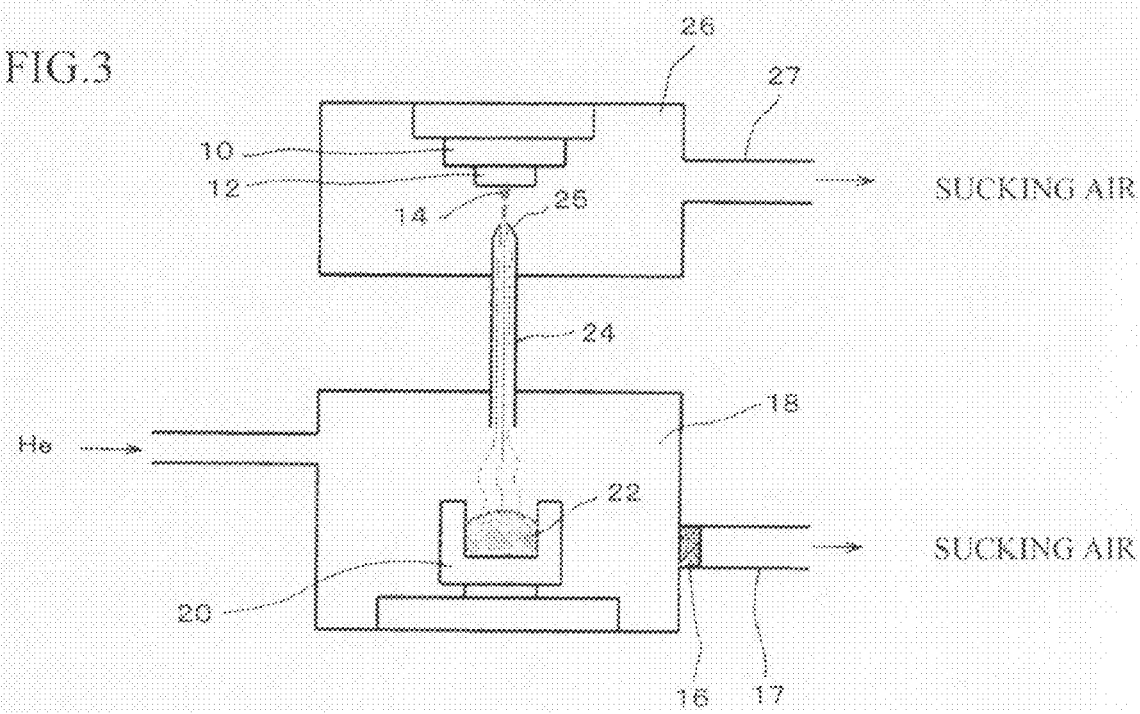
FIG. 3 is a schematic view of a gas deposition system for forming the micro metal bump shown in FIG. 2.

The gas deposition system is shown in FIG. 3. In the gas deposition system shown in FIG. 3, a vacuum is created in a chamber 18, from which air is evacuated through the vacuum line equipped with a filter 16, and a metal 22, e.g., gold, is heat-treated to a temperature of 1500° C. and evaporated in a melting pot 20 set in the chamber, so that metal nanoparticles can be produced. The metal nanoparticles are carried into a vacuum chamber 26 through a transfer tube 24 together with a helium gas, which has been supplied to the chamber 18 as a carrier gas.

Figure 2B:
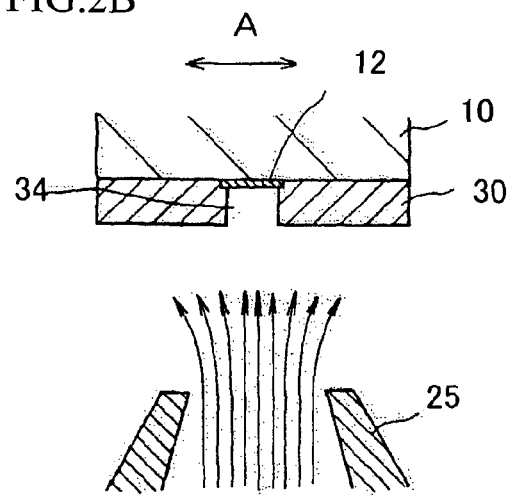

As shown in FIG. 2B, the substrate 10, on which the mask layer 30 including the straight holes 34, 34 . . . in which the surfaces of the wiring patterns 12 are exposed at the bottom of the holes, is set in the chamber 26. The metal nanoparticles are ejected from the nozzle 25, which is attached to a front end of the transfer tube 24, toward the straight holes 34, 34 . . . formed in the surface of the mask layer 30 together with the helium gas. The nozzle 25 is heated at a temperature of 300° C., and an inner diameter of the nozzle 25 is lager than that of the straight holes 34.

Figure 2C:
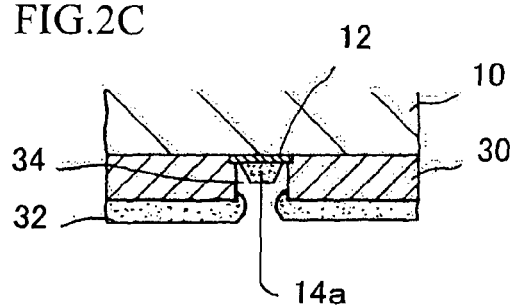

As shown in FIG. 2C, the metal nanoparticles, which have ejected into the chamber 26 from the nozzle 25, deposit onto the exposed surfaces of the wiring patterns 12, which are respectively exposed in the bottom surfaces of the straight holes 34, to form metal bumps 14 and further deposit onto the surface of the mask layer 30 to form a metal nanoparticle deposited layer 32, and the helium gas is evacuated through a vacuum line 27.

Figure 18:
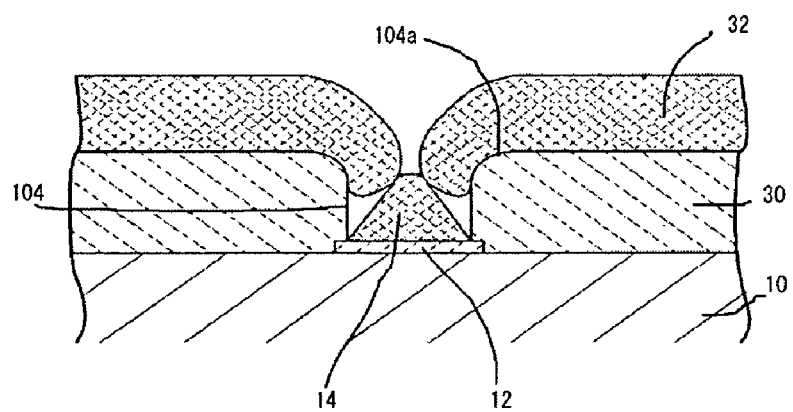
FIG. 18 is a partial cross sectional view, in which the metal nanoparticles are deposited on the surface of the mask layer, which is formed on the one side surface of the substrate and which includes the holes whose top opening portions are rounded, by the gas deposition system.
Figure 19:
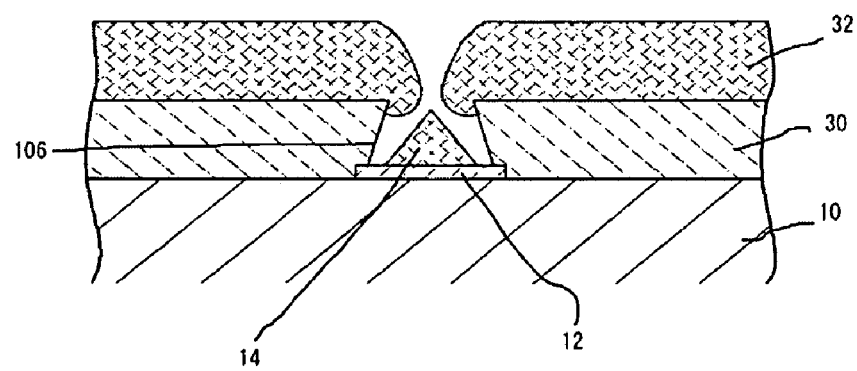
FIG. 19 is a partial cross sectional view, in which the metal nanoparticles are deposited on the surface of the mask layer, which is formed on the one side surface of the substrate and which includes reverse-tapered holes, by the gas deposition system.

Since the metal nanoparticles ejected from the nozzle 25 have been heated at 300° C. or higher, the mask 30 is heated by the metal nanoparticles depositing thereon. By storing the heat supplied from the metal nanoparticles in the mask layer 30, a temperature of the mask layer 30 is increased over an upper temperature limit of the resin constituting the mask layer 30, and top opening portions of the straight holes 34 are deformed and rounded like the top opening portion of the hole 104 shown in FIG. 18. If the metal nanoparticles further deposit in the hole formed like the hole 104 shown in FIG. 18, the metal bump 14 formed in the hole contacts the ends of the deposited layer 32 on the mask layer 30, which are inwardly extended from edges of the hole as shown in FIG. 18. In this state, the metal bump 14 will be peeled from the prescribed position of the wiring pattern 12 together with the mask layer 30 when the mask layer 30 is peeled from the substrate 10.

By adhering the other side surface of the substrate 10 onto the thick metal plate 35, whose are is larger than that of the substrate 10 and which is used as the heat sink, i.e., the cooling means, as shown in FIGS. 1A and 1B, the heat conducted from the metal nanoparticles to the mask layer 30 is rapidly radiated by the metal plate 35. With this structure, the temperature of the mask layer 30 can be lower than the upper temperature limit of the resin constituting the mask layer 30, so that the metal nanoparticles can be ejected from the nozzle 25, together with the carrier gas, with retaining the sharp edges at the top opening portions of the straight holes 34.

Figure 2D:
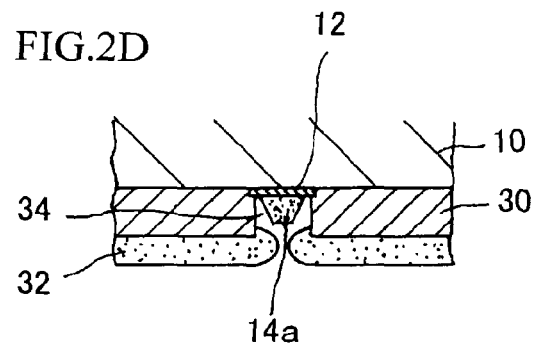

By further ejecting the metal nanoparticles from the nozzle 25, together with the carrier gas, with retaining the sharp edges at the top opening portions of the straight holes 34, the metal bump 14a deposited on the exposed surface of the wiring pattern 12, which is exposed as the bottom surface of the straight hole 34, is formed, and the ends of the deposited layer 32 on the mask layer 30 gradually inwardly are extended from the edges of the straight hole 34 as shown in FIGS. 2C and 2D, so that an opening part of the straight hole 34 is narrowed. Therefore, an amount of the metal nanoparticles depositing on the exposed surface of the wiring pattern 12, which is exposed as the bottom surface of the straight hole 34, is gradually reduced, so that the metal bump 14a having a configuration like a circular truncated cone can be formed.

While ejecting the metal nanoparticles from the nozzle 25, together with the carrier gas, with retaining the sharp edges at the top opening portions of the straight holes 34, the ends of the deposited layer 32 on the mask layer 30 are inwardly extended from the edges of the straight hole 34, a mechanism of the extension is thought as described below.

Figure 4:
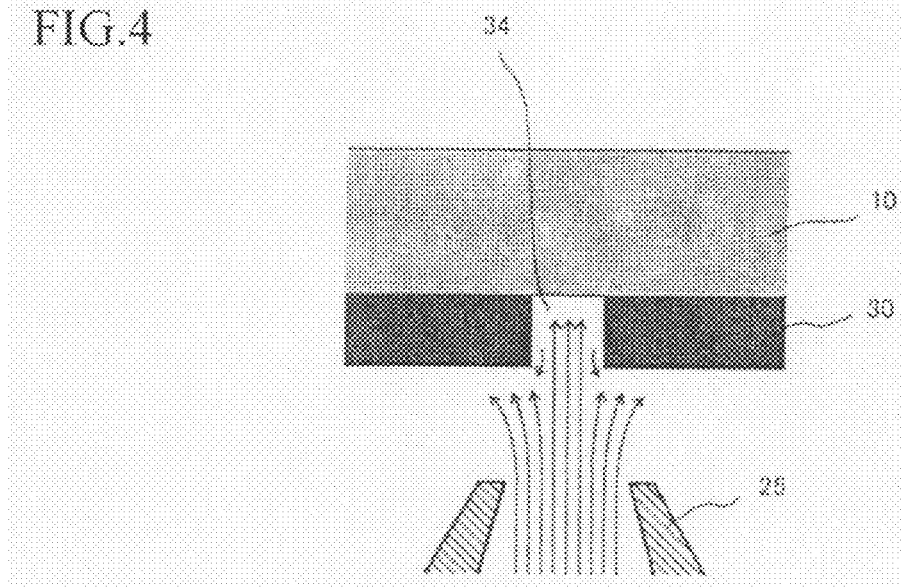
FIG. 4 is an explanation view explaining a phenomenon of protruding edges of a metal nanoparticle deposited layer from edges of a straight hole formed in a mask layer.

Namely, as shown in FIG. 4, the helium gas ejected into the straight hole 34 together with the metal nanoparticles turns to the direction opposite to the ejecting direction of the metal nanoparticles in the straight hole 34 and flows out therefrom, so a pressure of an inner part of the straight hole 34 is higher than that of the surface of the mask layer 30. Therefore, the metal particles ejected the top edges of the straight hole 34 cannot enter the straight hole 34, thereby they stick to the top edges of the straight hole 34 and the edges of the deposited layer 32 are protruded from the top edges of the straight hole 34.

Figure 2E:
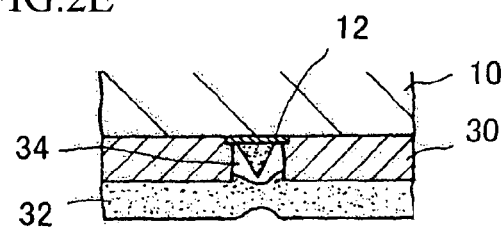
Figure 2F:
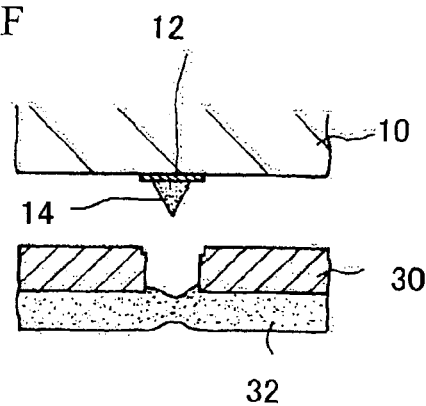

By further ejecting the metal nanoparticles from the nozzle 25 together with the carrier gas, the opening part of the straight hole 34 is fully closed by the edges of the deposited layer 32 formed on the mask layer 30 as shown in FIG. 2E. Therefore, the conical metal bump 14 separated from the deposited layer 32 can be formed on the exposed surface of the wiring pattern 12, which is exposed in the bottom surface of the straight hole 34.

Next, ejecting the metal nanoparticles and the helium gas from the nozzle 25 is stopped, the substrate 10 is taken out from the gas deposition system, and then the mask layer 30 and the deposited layer 32 can be mechanically peeled from the substrate 10 with retaining the conical configuration of the metal bump 14. After removing the mask layer 30, no metal nanoparticles stick onto the wiring pattern 12 except the metal bump 14.

Figure 5A:
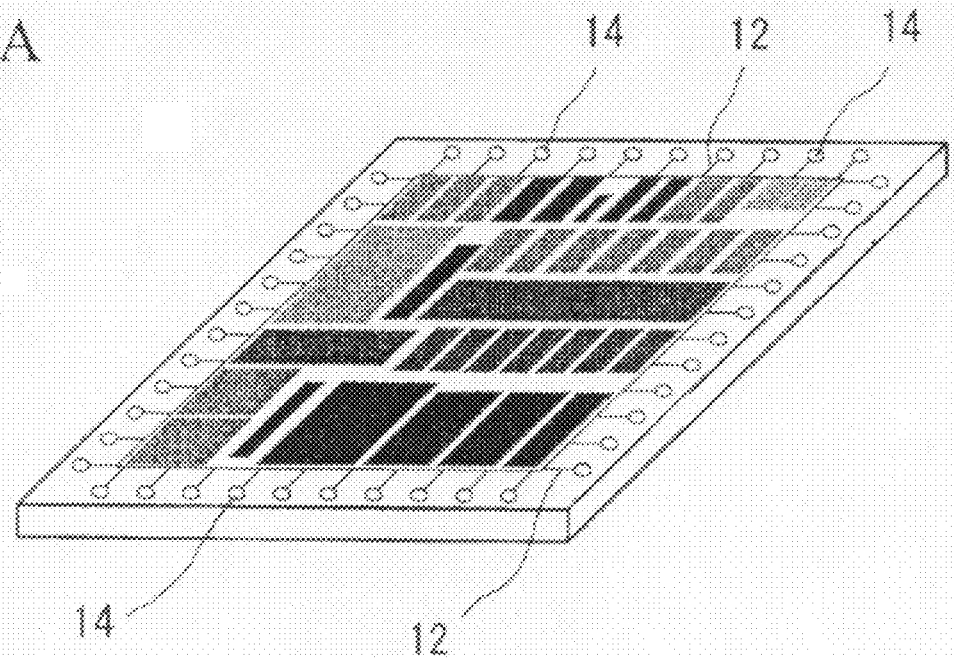
FIGS. 5A and 5B are a perspective view and a partially magnified perspective view of the substrate, in which wiring patters are formed in one side surface and conical metal bumps are formed at prescribed positions of the wiring patterns.
Figure 5B:
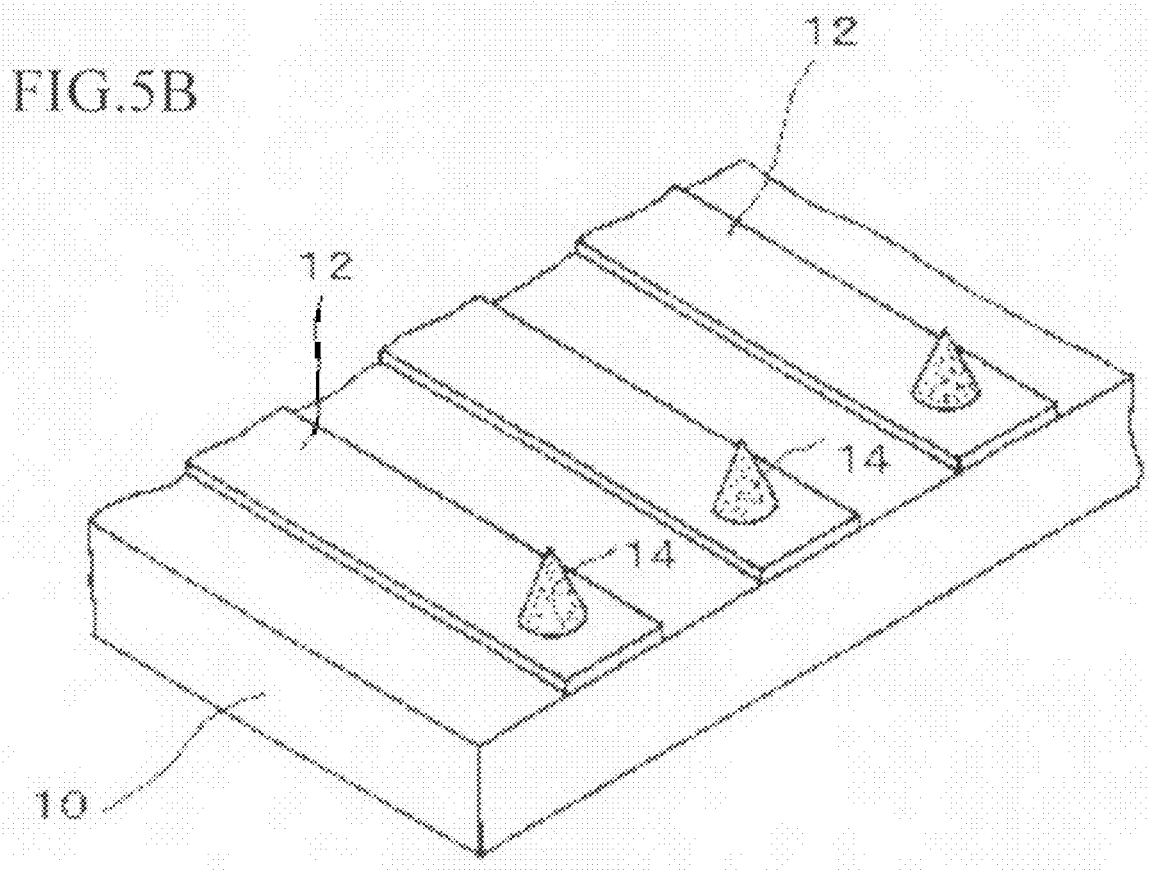

By the above described method, the metal bumps 14, 14 . . . can be formed along the peripheral edges of the substrate 10 as shown in FIG. 5A. A partially magnified perspective view of the metal bumps 14, 14 . . . are shown in FIG. 5B. The metal bumps 14, 14 . . . are respectively formed at the prescribes positions of the wiring patterns 12, 12 . . . as the conical metal bumps 14.

In case that the metal bumps 14 are respectively formed on a number of the wiring patterns 12, 12 . . . on the substrate 10, the substrate 10 or the nozzle 25 is moved from side to side (in the direction A) as shown in FIG. 2B, so that the conical metal bumps 14, which have the same configuration and the same height, can be formed on the wiring patterns 12.

By moving the substrate 10 or the nozzle 25 along the peripheral edges of the substrate 10 shown in FIG. 5A, the metal bumps 14, 14 . . . can be simultaneously formed along the peripheral edges of the substrate as shown in FIG. 5A. At that time, the metal nanoparticles, which are heated at 300° C. or higher and ejected from the nozzle 25, stick onto in outer edge parts of the substrate 10 without sticking onto a center part of the substrate 10. Therefore, the metal bumps 14, 14 . . . can be formed without thermal damaging semiconductor devices, etc. located in the center part of the substrate 10.

Figure 6A:
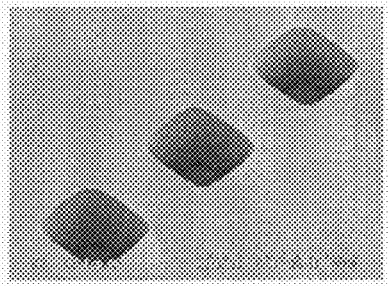
FIGS. 6A and 6B are electron micrographs of the straight holes of another example, which are formed in the mask layer.
Figure 6B:
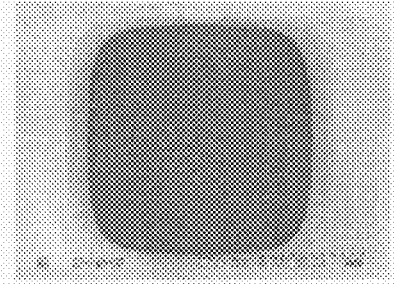
Figure 7A:
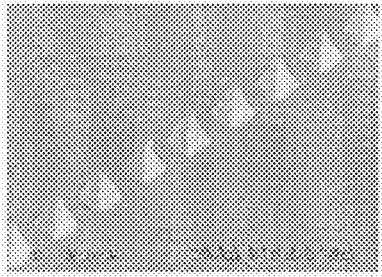
FIGS. 7A and 7B are electron micrographs of the metal bumps formed with using the mask layer including the straight holes shown in FIG. 4.
Figure 7B:
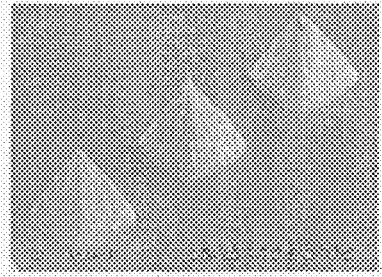

In FIGS. 1-5, the opening part of the straight hole 34 formed in the mask layer 30 has the circular configuration, but the metal bumps 14 having square pyramidal configurations shown in FIGS. 7A and 7B may be formed by forming the opening parts of the straight holes 34 formed in the mask layer 30 into rectangular configurations as shown in FIGS. 6A and B. Note that, FIG. 6B is the magnified view of FIG. 6A; FIG. 7B is the magnified view of FIG. 7A.

By the way, the mask layer 30 should be tightly adhered on the one side surface of the substrate 10, generally the mask layer 30 including the straight holes 34 is formed by optically exposing and developing a photoresist layer having a prescribed thickness, which has been formed on the one side surface of the substrate 10, and the mask layer is heat-treated so as to tightly adhered onto the one side surface of the substrate.

Figure 8A:
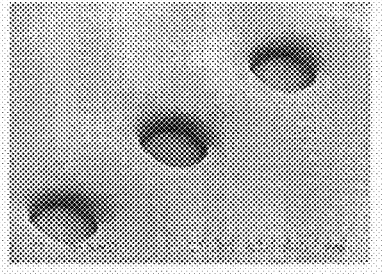
FIGS. 8A and 8B are electron micrographs of the straight holes, which are formed in the mask layer and whose top opening portions are rounded.
Figure 8B:
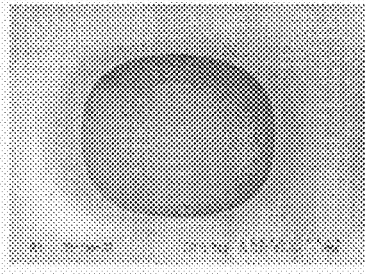
Figure 9A:
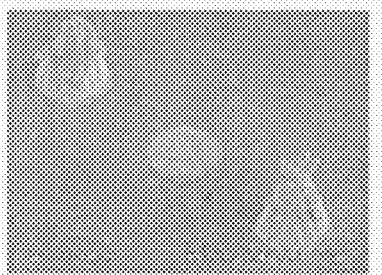
FIGS. 9A and 9B are electron micrographs of the metal bumps formed with using the mask layer including the straight holes shown in FIG. 6.
Figure 9B:
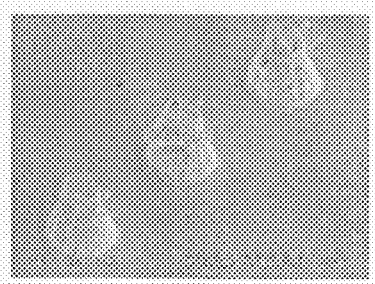

If the heat treatment is performed at high temperature so as to fully adhere the mask layer onto the one side surface of the substrate 10, the top opening portions of the straight holes 34 is rounded as shown in FIGS. 8A and 8B (FIG. 8B is an magnified view of FIG. 8A) like the hole 104 shown in FIG. 18. By using the mask layer 30 including the straight holes shown in FIGS. 8A and 8B, metal bumps having different configurations are formed as shown in FIGS. 9A and 9B.

Therefore, when the mask layer 30, which has been formed by forming the photoresist layer having the prescribed thickness on the one side surface of the substrate 10 and optically exposing and developing the photoresist layer to form the straight holes 34, is heat-treated, the heat treatment is performed at a suitable temperature capable of retaining the shapes at the top opening portions of the straight holes 34. Preferably, the heat treatment is performed at a temperature of 100° C. or below.

Experiments of the above described manner will be explained with reference to FIGS. 10-12. In each of the drawings, "B" is a perspective view of "A". To form the mask layers 30, firstly photoresist (AZ4903 produced by Clariant Corporation) was applied onto one side surfaces of wafers, which act as the substrates 10, by a spin coater, so as to form photoresist layers. A rotational speed of the spin coater was 3500 rpm and a spin time for forming each photoresist layer was 30 seconds.

Next, the photoresist layers were pre-baked at 100° C. for five minutes so as to evaporate a solvent in the photoresist layers and sufficiently adhere the photoresist layers to the wafers.

Next, the photoresist layers were exposed using an ultraviolet ray (g-line having a wavelength of 427 nm) and developed so as to form the straight holes 34 having the sharp configurations as shown in FIG. 6. The optical exposure dose for each photoresist layer was 800 mJ/cm$^2$. After completing the optical exposure, the development was performed by dipping in a developing solution (a diluted solution wherein a mixing ratio of AZ4903 developer:purified water was 1:4) at room temperature for three minutes, and then the wafers were rinsed in purified water.

Then, the photoresist layers were post-baked at 80-120° C. for five minutes so as to remove a solvent and water from the photoresist layers, in which the straight holes 34 had been formed, and fully adhere the photoresist layers to the wafers.

Figure 10A:
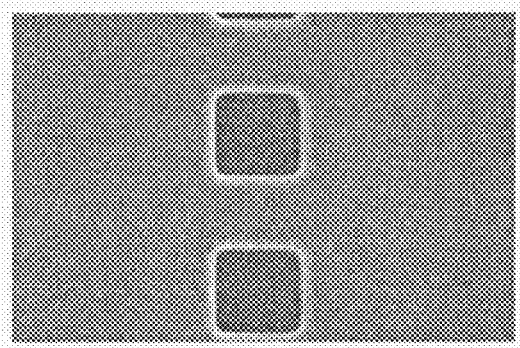
FIGS. 10A and 10B are electron micrographs of the holes in the mask layer which has been post-baked at a temperature of 80° C.
Figure 10B:
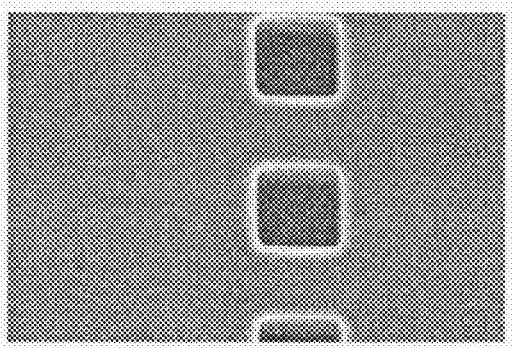
Figure 11A:
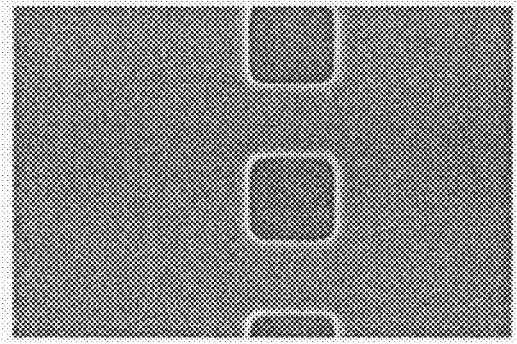
FIGS. 11A and 11B are electron micrographs of the holes in the mask layer which has been post-baked at a temperature of 90° C.
Figure 11B:
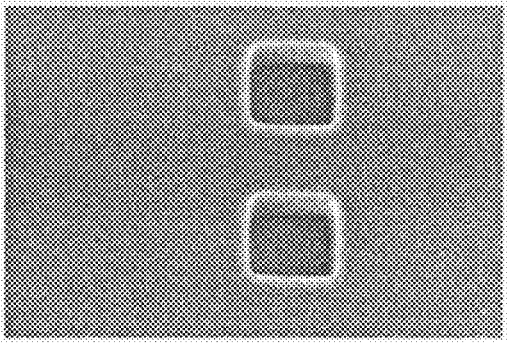
Figure 12C:
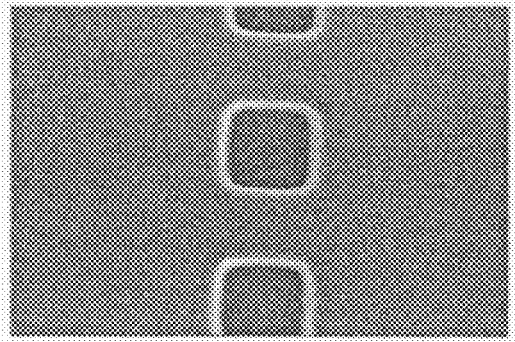
FIGS. 12A and 12B are electron micrographs of the holes in the mask layer which has been post-baked at a temperature of 100° C.
Figure 12B:
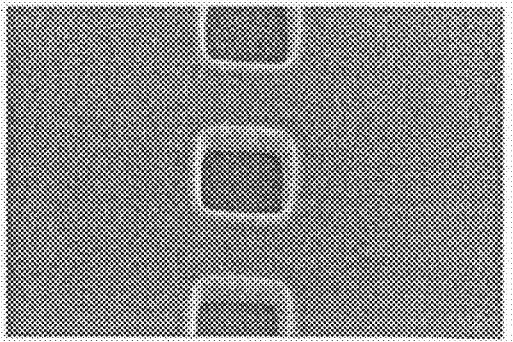

The holes formed in the post-baked mask layers 30 are shown in FIGS. 10-12. In FIG. 10, the post-baking temperature was 80° C.; in FIG. 11, the post-baking temperature was 90° C.; in FIG. 12, the post-baking temperature was 100° C. As shown in the drawings, the shapes at the top opening portions of the straight holes 34 could be retained at 100° C. or below while post-baking the photoresist layers.

In case that the post-baking temperature was higher than 100° C. the top opening portions of the straight holes 34 were rounded like the holes shown in FIGS. 8A and 8B.

In the above described embodiment, gold is used as the metal 22 in the melting pot 20 set in the chamber 18 of the gas deposition system shown in FIG. 3, but other metals, e.g., palladium, platinum, silver, nickel, copper, may be used as the metal.

By using a number of nozzles 25 from which several kinds of metal nanoparticles are ejected in order, the metal bump 14 composed of several kinds of metals, e.g., the metal bump 14 including a lower part composed of nickel and an upper part composed of gold, can be formed. By using the metal bumps 14 composed of several kinds of metals, hardness, etc. of the metal bumps 14 can be controlled and production cost of the metal bumps 14 can be reduced.

Further, in case that the substrate 10 to be set in the chamber 26 of the gas deposition system is mounted onto an X-Y stage in a state of being mounted on the metal plate 35 and the metal nanoparticles are ejected from the nozzle 25 toward the selected straight holes 34, uniformity of the configurations of the metal bumps 14 formed in the straight holes 34 can be improved and rise of temperature of the mask layer 30 can be prevented.

In case that the multiple straight holes 34, 34 . . . are formed in the substrate 10, the metal nanoparticles can be ejected toward only the selected straight holes 34, in which the metal bumps 14 will be selectively formed, by using the X-Y stage, so that a time for depositing the metal nanoparticles can be shortened and uniformity of the metal bumps 14 can be improved.

Further, the metal plate 35, on which the substrate 10 is mounted, may be cooled by a suitable cooling method e.g., cooling water as a coolant, Peltier device as a cooling device. By cooling the metal plate, a deposition temperature of the metal nanoparticles can be stabilized, and rising temperature at the mask layer 30 can be prevented.

Note that, the mask layer 30 is mechanically peeled, and the mask layer 30 can be removed by chemical etching. In case of performing the chemical etching, it is necessary to confirm etching conditions so as not to damage the metal bumps 14 formed in the straight holes 34.

In the mean time, the inner diameter of the straight hole 34 formed in the mask layer 30 correlates with a height of the tapered metal bump 14 formed therein, for example, the tapered metal bump 14 having a height of 5 μm is formed in the straight hole 34 having an inner diameter of 5 μm, and the tapered metal bump 14 having a height of 3 μm is formed in the straight hole 34 having an inner diameter of 3 μm.

Thus, as shown in FIG. 13, by forming a number of straight holes 34 having different inner diameters using the same mask layer, the metal bumps having different heights can be formed, the experiment was performed as described below.

Figure 13A:
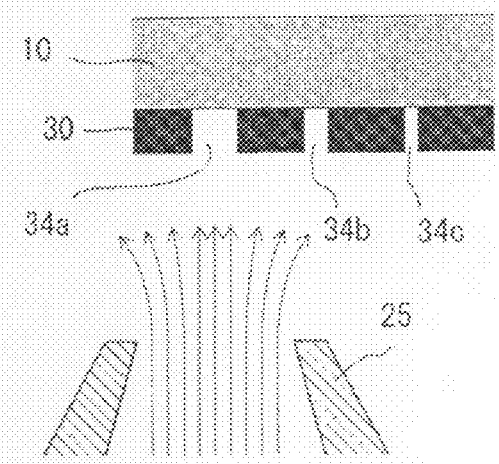
FIGS. 13A-13D are explanation views showing a process of forming a number of straight holes having different inner diameters in the same mask layer and forming tapered metal bumps having different heights.

Firstly, as shown in FIG. 13A, a number of straight holes 34a, 34b and 34c (inner diameter of the hole 34a>inner diameter of the hole 34b>inner diameter of the hole 34c) were formed in the same mask layer 30 formed on the one side surface of the substrate 10. The aspect ratios of the straight holes 34a, 34b and 34c were 1 (the hole 34a), 2 (the hole 34b) and 3.3 (the hole 34c).

The metal nanoparticles were ejected from the nozzle 25 toward the straight holes 34a, 34b and 34c. In this case, the substrate 10 was moved sideward.

Figure 13B:
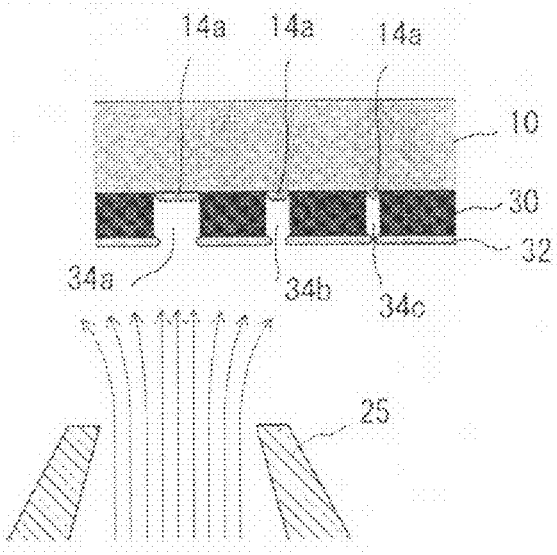

By ejecting the metal nanoparticles from the nozzle 25 toward the straight holes 34a, 34b and 34c, as shown in FIG. 13B, the metal nanoparticles deposited on the exposed surfaces of the wiring patterns 12 (not shown in FIG. 13), which were exposed in the bottom surfaces of the straight holes 34a, 34b and 34c, and formed the metal bumps 14a having the configurations like circular truncated cones. Further, the metal nanoparticles deposited to form the deposited layer 32 on the surface of the mask layer 30, and edges of the deposited layer 32 inwardly were extended from edges of the straight holes 34a, 34b and 34c.

Figure 13C:
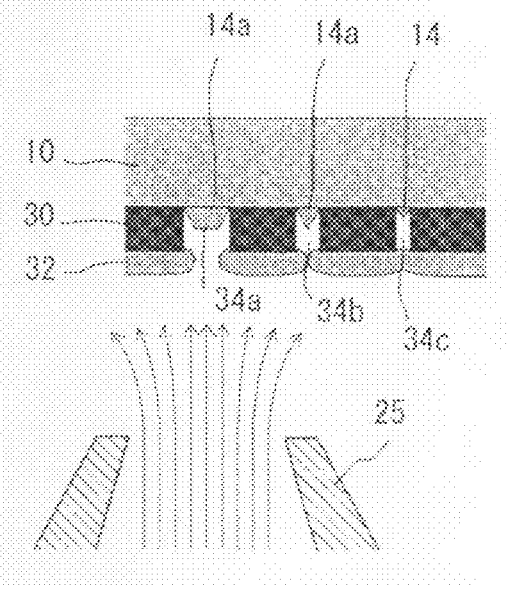

By further ejecting the metal nanoparticles from the nozzle 25 toward the straight holes 34a, 34b and 34c, as shown in FIG. 13C, the opening part of the straight hole 34c, which had the smallest inner diameter, was choked, and the opening part of the straight hole 34b, which had the intermediate inner diameter, was extremely narrowed.

Figure 13D:
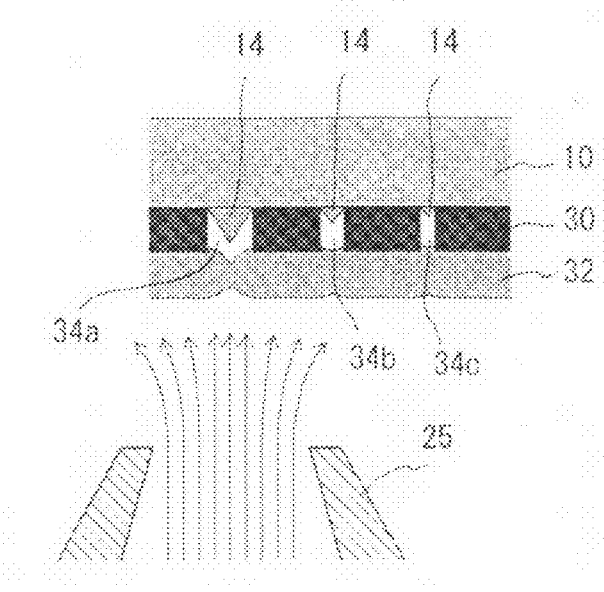
Figure 14A:
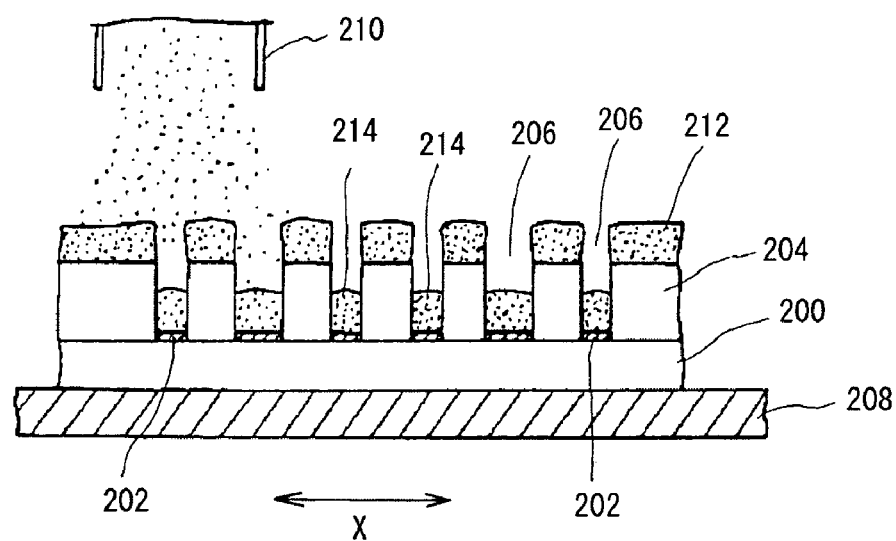
FIGS. 14A and 14B are explanation views showing the conventional method of forming the tapered metal bump on the substrate by using a gas deposition process.
Figure 14B:
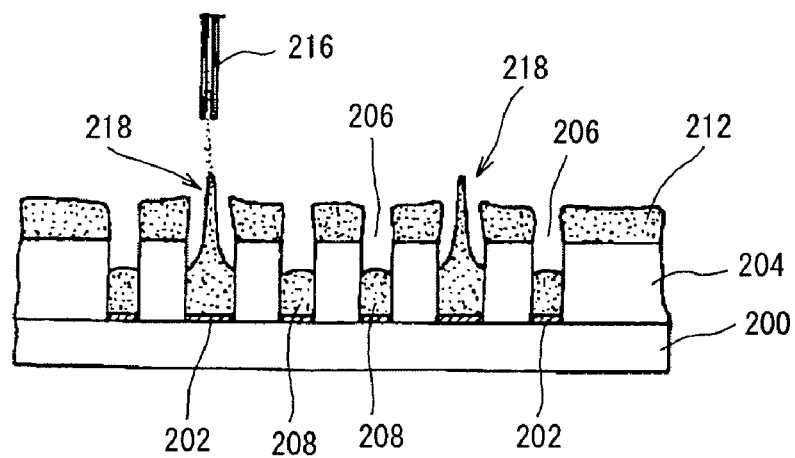
Figure 17:
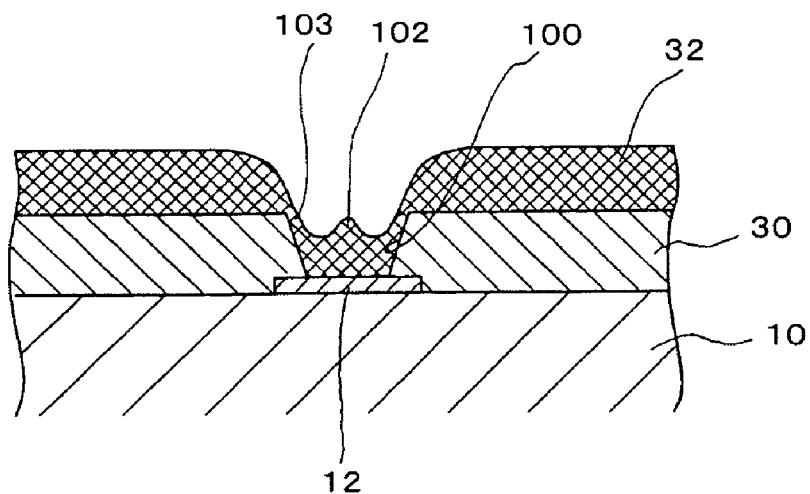
FIG. 17 is a partial cross sectional view, in which the metal nanoparticles are deposited on the surface of the mask layer by the gas deposition system shown in FIG. 16.

The metal nanoparticles were further ejected from the nozzle 25 toward the straight holes 34a, 34b and 34c, but the configuration of the tapered metal bump 14 in the straight hole 34c, which had the smallest inner diameter and whose opening part had been fully covered by the deposited layer 32, was retained as shown in FIG. 13D. On the other hand, the opening part of the straight hole 34b, which had been extremely narrowed, was fully closed by the deposited layer 32, and then the configuration of the tapered metal bump 14 in the straight hole 34b was retained.

In the straight hole 34a having the largest inner diameter, the height of the metal bump 14a having the configuration like a circular truncated cone was increased until the opening part was fully covered by the deposited layer 32. When the opening part of the straight hole 34a was fully covered by the deposited layer 32, the metal bumps 14, 14 and 14, which were respectively formed in the straight holes 34a, 34b and 34c, had different heights, each of which was nearly equal to the inner diameter of the corresponding straight hole 34a, 34b or 34c.

What is the claimed is:

1. A method of forming a micro metal bump comprising the steps of:
    forming a straight hole in a mask layer covering one side surface of a substrate on which a metal part is formed, wherein a prescribed position of the metal part is exposed in a bottom surface of the straight hole and the straight hole has an inner wall perpendicular to the one side surface of the substrate and a sharp top opening portion;
    providing cooling means on the other side surface of the substrate;
    placing the substrate and the cooling means in a vacuum;
    forming a tapered metal bump with a cross sectional area that is gradually reduced from a bottom part to a top part in contact with the metal part, on the exposed surface of the metal part, which is exposed in the bottom surface of the straight hole, by a gas deposition process, in which metal nanoparticles obtained by evaporating a metal are ejected from a nozzle together with a carrier gas so as to deposit the metal nanoparticles on the prescribed position, with cooling the substrate to a temperature lower than upper temperature limit of resin constituting the mask layer, by the cooling means, so as to retain a configuration of the straight hole, an inner diameter of the nozzle being larger relative to an inner diameter of said straight hole with the inner diameter of the straight hole being narrowed towards an ejection portion, said tapered metal bump having a predetermined height with opening parts of the straight hole being closed by a deposited layer formed on the mask layer without contacting the tapered metal bumps for depositing the metal nanoparticles in the straight hole; and removing the mask layer from the one side surface of the substrate so as to complete the tapered metal bump at the prescribed position of the metal part.

2. The method according to claim 1, wherein the mask layer, in which the straight hole has been formed by optically exposing and developing a photoresist layer having a prescribed thickness and being formed on the one side surface of the substrate, is heated at a prescribed temperature capable of retaining the shape at the top opening portion of the straight hole so as to adhere the mask layer onto the one side surface of the substrate.

3. The method according to claim 2, wherein the heat treatment is performed at a temperature of 100° C. or below.

4. The method according to claim 1, wherein the cooling means is a metal heat sink.

5. The method according to claim 1, wherein the tapered metal bump is formed into a conical shape or a polygonal shape.

6. The method according to claim 1, wherein a number of the straight holes having different inner diameters are formed in the same mask layer, and a number of the tapered metal bumps having different heights are simultaneously formed.

7. The method according to claim 1, wherein the metal to be evaporated is gold, and the carrier gas is a helium gas.

8. The method according to claim 1, wherein a plurality of tapered metal bumps are formed on the substrate by ejecting the metal nanoparticles, together with the carrier gas, towards the straight holes formed in the mask layer with moving the substrate or the nozzle so as to relatively move the nozzle along the surface of the substrate.

9. The method according to claim 1, wherein the carrier gas ejected into the straight hole together with the metal nanoparticles is turned to the direction opposite to the ejecting direction of the metal nanoparticles in the straight hole and flows out from the vicinity of the top edges of the opening part of the straight hole, a part of the flow paths of the carrier gas and the metal nanoparticles, which flow out from the vicinity of the top edges of the opening part of the straight hole, is horizontally directed in the vicinity of the top edges of the opening part, the metal nanoparticles stick to top edges of the straight hole so as to form the deposited layer and protrude the ends of the deposited layer toward the center of the straight hole and the metal nanoparticles deposited in the straight hole so that the tapered metal bump is formed therein.

* * * * *